(12) United States Patent
Someno

(10) Patent No.: US 7,382,508 B2
(45) Date of Patent: Jun. 3, 2008

(54) HOLOGRAPHIC RECORDING MEDIUM AND WRITING METHOD THEREFOR

(75) Inventor: Yoshihiro Someno, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 273 days.

(21) Appl. No.: 11/139,094

(22) Filed: May 27, 2005

(65) Prior Publication Data

US 2005/0266347 A1    Dec. 1, 2005

(30) Foreign Application Priority Data

Jun. 1, 2004    (JP)    ............................. 2004-163043

(51) Int. Cl.
*G03H 1/28* (2006.01)
(52) U.S. Cl. .......................... 359/24; 359/10
(58) Field of Classification Search .................. 359/10, 359/11, 24

See application file for complete search history.

(56) References Cited

U.S. PATENT DOCUMENTS

| | | | | |
|---|---|---|---|---|
| 3,632,869 A | * | 1/1972 | Bartolini et al. | ............... 348/97 |
| 4,001,874 A | * | 1/1977 | Lacotte | ........................ 348/41 |
| 4,958,338 A | * | 9/1990 | Miller | ..................... 369/59.24 |
| 5,671,073 A | * | 9/1997 | Psaltis et al. | .................. 359/22 |
| 2002/0191236 A1 | | 12/2002 | King | |

* cited by examiner

*Primary Examiner*—Arnel C Lavarias
(74) *Attorney, Agent, or Firm*—Beyer Law Group LLP

(57) ABSTRACT

A holographic recording medium having a recording layer on which holograms are formed by interference between an object beam and a reference beam to thereby record information. The recording layer is formed with a plurality of hologram groups each composed of a plurality of holograms. The holograms in each of the hologram groups have the same information, and adjacent holograms partially overlap each other. In addition, the holograms are arranged to be spaced apart from holograms in other hologram groups.

4 Claims, 4 Drawing Sheets

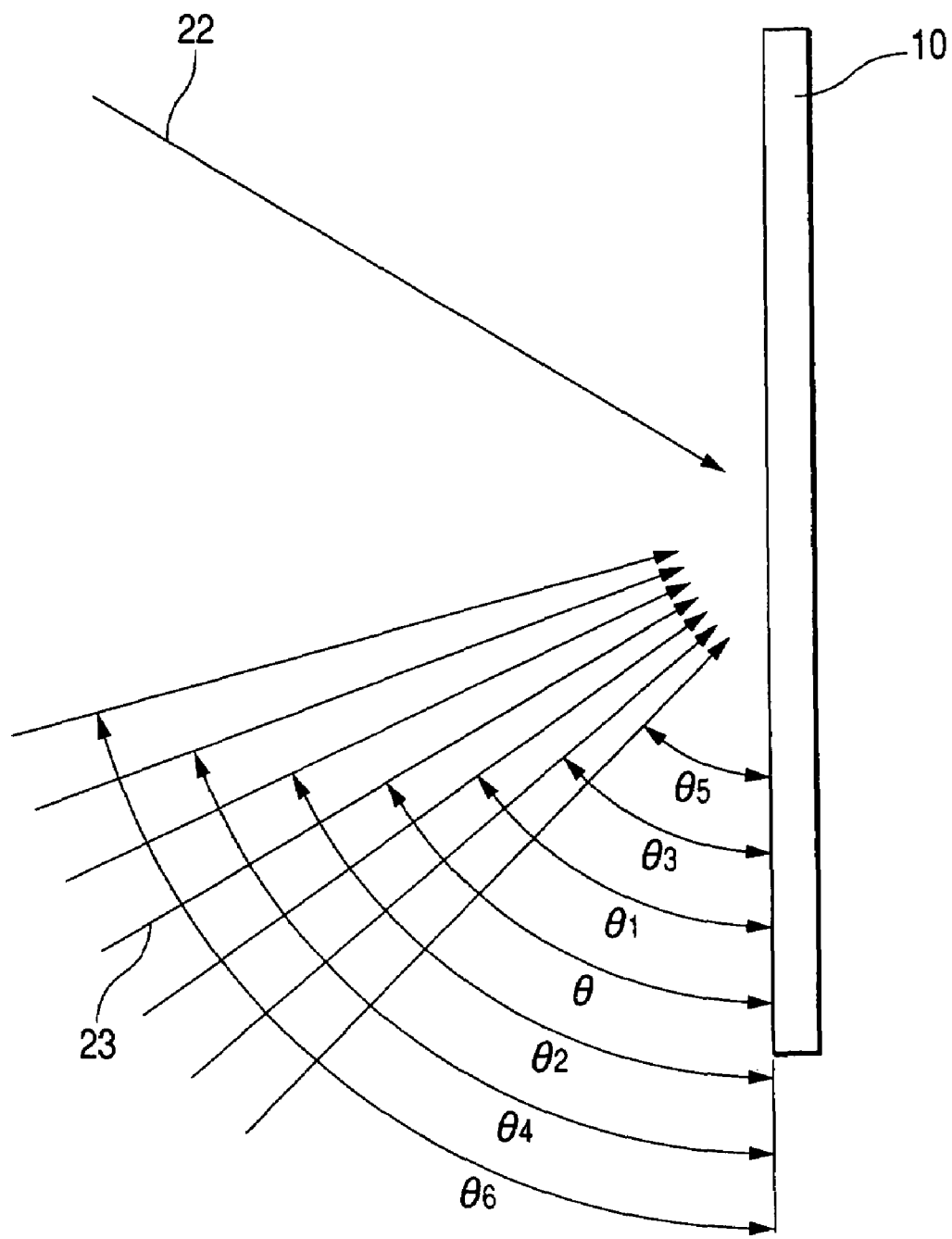

HOLOGRAPHIC RECORDING MEDIUM AND WRITING METHOD THEREFOR

BACKGROUND OF THE INVENTION

1. Field of the Invention

The present invention relates to a holographic recording medium written and read by a holographic storage device, and to a writing method therefor.

2. Description of the Related Art

Conventionally, as a storage device used in a computer and the like, storage devices are widely being used in which information is two-dimensionally written or read with respect to a recording medium by a magnetic or optical method. A hard disk is known as a storage medium using magnetism, and a CD or DVD is known as a storage medium using light. These storage media are remarkably advanced in a recording density to meet a demand on a large amount of capacity. Also, as a means for a larger amount of capacity, storage media using the holographic principle are under development.

The holographic storage devices read information recorded on the recording medium as holograms in a page unit to reproduce it. On the recording medium, coded information in a page unit is written as a pattern, for example, in which an index of refraction varies. The pattern is a hologram formed by interference between an object beam and a reference beam in a storage device. Also, in order to read the information from the recording medium, the reference beam alone is incident on the recording medium, is diffracted by the hologram pattern, and is received by a photoelectric transducer, such as a CCD or a CMOS. In this way, the written information can be reproduced. Such a holographic storage device is, for example, disclosed in Japanese Unexamined Patent Application Publication No. 2003-43904.

However, when the incidence angles of the reference beam with respect to the holographic recording medium are different from each other in writing and reading information, the reference beam is not diffracted by a pattern of the hologram, so that the written information cannot be read because the wave front of the object beam in writing the information is not reproduced. For this reason, when the information recorded on the holographic recording medium is read, very high precision is required with respect to the reference beam incident on the holographic recording medium, which leads to an increase in manufacturing costs.

SUMMARY OF THE INVENTION

The present invention is designed to solve the above problems, and it is an object of the invention to provide a holographic recording medium from which desired information can be read even when the incidence angle of a reference beam on the holographic recording medium deviates.

According to an aspect of the invention, there is provided a holographic recording medium having a recording layer on which holograms are formed by interference between an object beam and a reference beam to thereby record information. The recording layer is formed with a plurality of hologram groups each composed of a plurality of holograms. The holograms in each of the hologram groups have the same information, partially overlap each other, and are arranged to be spaced apart from holograms in other hologram groups.

Further, in the holographic recording medium according to the invention, it is preferable that each of the hologram groups be composed of a hologram formed by the object beam and the reference beam making a predetermined angle therebetween and a plurality of sub-holograms which have the same information and which are formed at an angle different from the predetermined angle between the object beam and the reference beam at which the hologram is formed.

Furthermore, in the holographic recording medium according to the invention, it is preferable that the holograms in each of the hologram groups be arranged to have a periodic structure.

In addition, according to another aspect of the invention, there is provided a method of writing information on a holographic recording medium which forms holograms having coded information on a recording layer by interference between an object beam and a reference beam. The writing method includes the process of: forming a hologram on the recording layer by the object beam and the reference beam making a predetermined angle therebetween, and forming a plurality of sub-holograms having the same information as the hologram on the recording layer by sequentially varying the incidence angle of the reference beam, thereby forming a hologram group composed of a plurality of holograms that partially overlap each other.

BRIEF DESCRIPTION OF THE DRAWINGS

FIG. 4 is a view schematically illustrating a method of writing information on a holographic recording medium according to the invention.

DESCRIPTION OF THE PREFERRED EMBODIMENT

Figure 1:
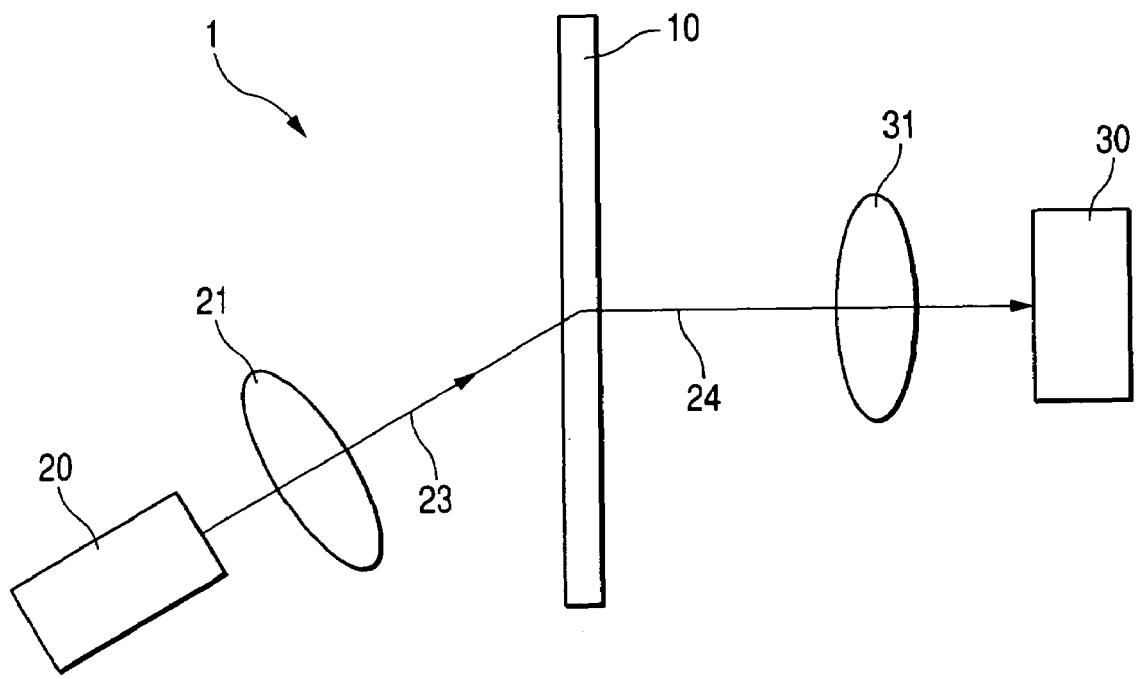
FIG. 1 is a view schematically illustrating a holographic storage device according to an embodiment of the invention.
Figure 2:
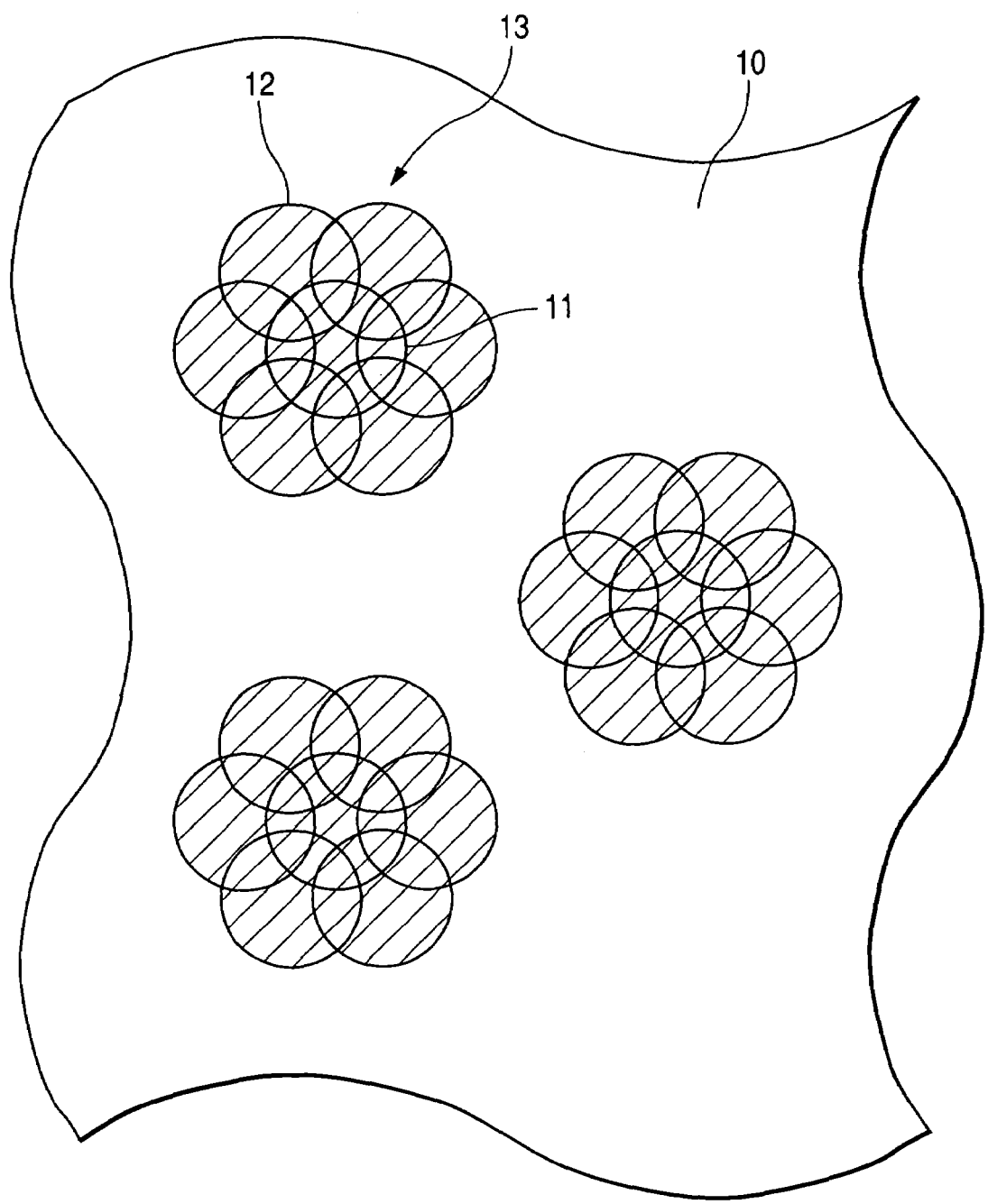
FIG. 2 is a view schematically illustrating a holographic recording medium of the present embodiment.
Figure 3:
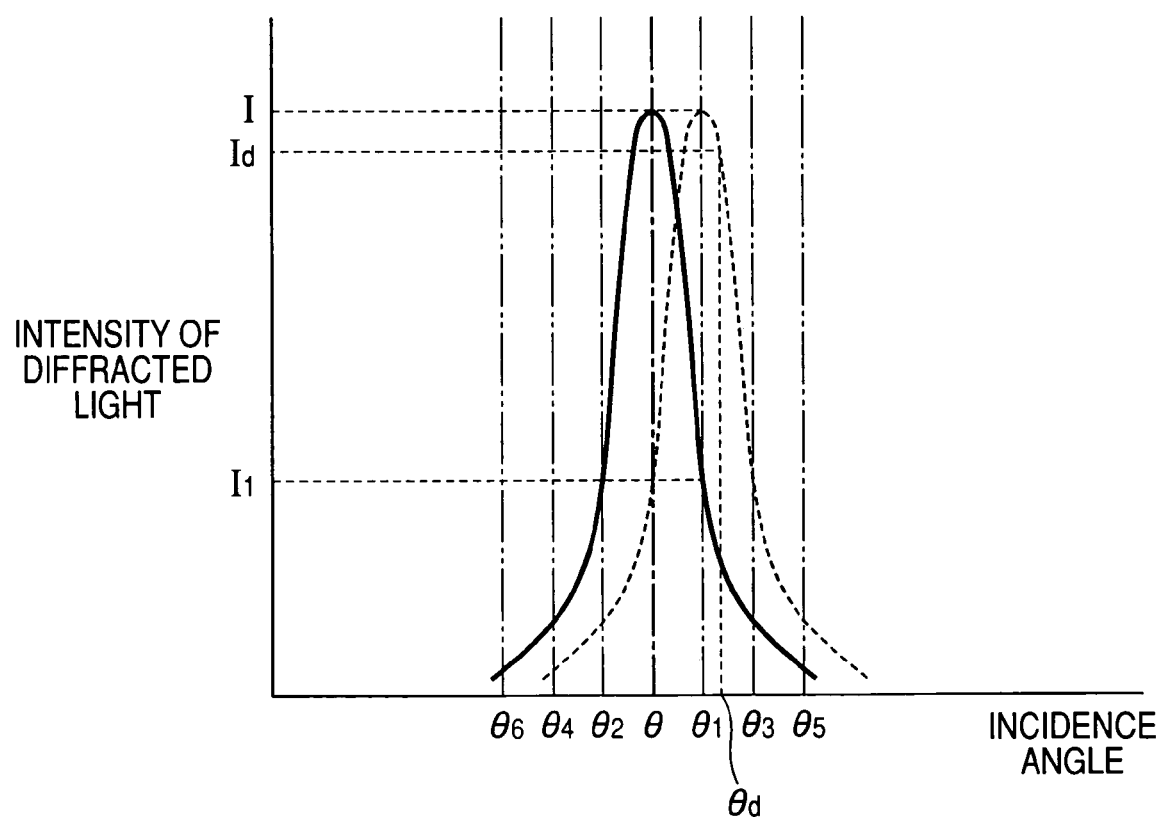
FIG. 3 is a view illustrating the relationship between an incidence angle of a reference beam and the intensity of diffracted light.

Hereinafter, a preferred embodiment of the present invention will be described in detail with reference to the drawings. FIG. 1 is a view schematically illustrating a holographic storage device. FIG. 2 is a view schematically illustrating a holographic recording medium of the present embodiment. FIG. 3 is a view illustrating the relationship between an incidence angle of a reference beam and the intensity of diffracted light. FIG. 4 is a view schematically illustrating a method of writing information on the holographic recording medium in the present embodiment.

A holographic recording medium 10 of the present embodiment of the invention is configured such that an object beam 22 having coded information in a page unit and a reference beam 23 are incident thereon, and then interference fringe between the object beam 22 and the reference beam 23 is formed as a hologram, and thus information can be written. The information can be read by a hologram storage device 1.

As shown in FIG. 1, the holographic storage device 1 includes a laser beam source 20 for emitting the reference beam 23 and a light receiving unit 30 in which diffracted light 24, made by the reference beam 23 diffracted on the holographic recording medium 10, is detected to read the information. Also, the laser beam source 20 has a lens 21 for modifying a laser beam emitted therefrom into parallel light, and the light receiving unit 30 has a lens 31 for focusing the diffracted light 24.

When the information recorded on the holographic recording medium 10 is read, light having the wavelength of the reference beam 23 used to form a hologram 11 is incident on the holographic recording medium 10 at the same angle as when the information is written. The incident reference beam 23 is diffracted by the hologram 11 formed on the holographic recording medium 10, and the diffracted light 24 is received by the light receiving unit 30, and thus written information can be read.

As shown in FIG. 2, on the holographic recording medium 10 of this embodiment of the invention, a plurality of hologram groups 13, each composed of a plurality of holograms 11, is formed. In addition, the holograms 11 in the hologram group 13 partially overlap each other, and are arranged to have a periodic structure and to be spaced apart from the holograms 11 in other hologram groups 13. The hologram group 13 is composed of a hologram 11 and a plurality of sub-holograms 12 each of which has the same information. The hologram 11 is formed by forming a predetermined angle between the object beam 22 having coded information and the reference beam 23, and the sub-holograms 12 are formed by varying little by little the incidence angle of the reference beam 23 with respect to the object beam 22 when the hologram 11 has been formed.

Now, a case will be described in which the incidence angle of the reference beam 23 is different from when the information is written. The location of the holographic recording medium 10 may deviate minutely from a predetermined location due to impact from the outside with respect to the holographic storage device 1, or arrangement errors in arranging the holographic recording medium 10, or dust. FIG. 3 is a view illustrating the relationship between the incidence angle of the reference beam 23 with a constant wavelength and the intensity of diffracted light at the hologram 11 at that time. Here, the incidence angle of the reference beam 23 when a hologram of a hologram group is formed is denoted by θ, the incidence angles of the reference beam 23 when sub-holograms of the hologram group are formed are denoted by $\theta_1$ to $\theta_6$, respectively.

For the hologram 11 on which the reference beam 23 is incident at the incidence angle θ, when the incidence angle of the reference beam 23 in reading information is θ, as shown in FIG. 3, the intensity of the diffracted light 24 becomes I, and thus the sufficient intensity of the diffracted light can be obtained. However, when the incidence angle of the reference beam 23 becomes $\theta_1$ to deviate from θ, the intensity of the diffracted light 24 diffracted by the hologram 11 is $I_1$, so that it is not possible to obtain the sufficient intensity of diffracted light. Accordingly, the written information can not be read. However, the reference beam 23 having an incidence angle $\theta_1$ can obtain the intensity of diffracted light I by the sub-hologram 12 formed at the incidence angle $\theta_1$. Similarly, when the incidence angle of the reference beam 23 becomes $\theta_2$ to $\theta_6$, it is possible to obtain the intensity of diffracted light I by the sub-holograms 12 formed at incidence angles of $\theta_2$ to $\theta_6$. Moreover, when the incidence angle of the reference beam 23 becomes an intermediate angle $\theta_d$, the reference beam 23 is diffracted by the sub-hologram 12 formed at an incidence angle closest to $\theta_d$, and the intensity of the diffracted light $I_d$ becomes weaker than I, but it is still possible to obtain sufficient intensity.

Conventionally, very high precision has been required for the incidence angle of the reference beam 23 when the information recorded on the holographic recording medium 10 is read. However, when the holographic recording medium 10 of the present invention is used, even in a case in which the incidence angle of the reference beam 23 deviates, the information can be read by one of the sub-holograms 11 in the hologram group 13. Further, since very high precision has been required for the incidence angle of the reference beam 23, reading errors on the recorded information increase, and thus there has been needed a number of error correction codes. However, when the holographic recording medium 10 of the present invention is used, the reading errors can be suppressed, and accordingly, it is possible to reduce the number of error correction codes.

Further, since the hologram group 13 is arranged to be spaced apart from other hologram groups 13, it is possible to prevent the reading error in that the reference beam 23 is diffracted by the hologram 11 of another hologram group 13. In addition, the holograms in the hologram group 13 are arranged to have a periodic structure, respectively. For this reason, even in a case in which the reference beam 23 deviates in any direction, the reference beam 23 can be diffracted by any one of the holograms 11 in the hologram group 13. Accordingly, reading errors due to the deviation of the incidence angle can be removed, and as a result, reading can be reliably performed.

Furthermore, when a reference beam is incident on a holographic recording medium, the relationship between a wavelength λ and an incidence angle θ of the reference beam for diffraction at a hologram formed on the holographic recording medium is represented by the following expression:

$$n\lambda = 2d \sin \theta \text{(where n is a positive integer, and d is a gap between lattice surfaces)} \quad (1).$$

That is, the wavelength λ and the incidence angle θ of the reference beam 23 have an equivalent relation. Accordingly, even though the wavelength of the reference beam 23 deviates due to the ambient temperature of a laser or the like, the reference beam 23 diffracts satisfying the above expression (1) by one hologram 11 or one sub-hologram 12 in the hologram group 13, so that the sufficient intensity of diffracted light can be obtained. As a result, it becomes possible to use an inexpensive laser beam source.

Next, a method of writing information on the holographic recording medium 10 in the embodiment of the invention will be described. First, as shown in FIG. 4, an object beam 22 having coded information and a reference beam 23 are incident on the holographic recording medium 10 with a predetermined angle θ formed therebetween, and then a hologram 11 is formed on a recording layer of the holographic recording medium 10 to thereby record information.

Subsequently, by deviating the incidence angle of the reference beam 23 with respect to the same information to become θ1, the sub-hologram 12 is formed at a location partially overlapping the hologram 11. Further, the incidence angle of the reference beam 23 varies from θ2 to θ6 such that sub-holograms 12 have a periodic structure, to thereby form the sub-holograms 12 one by one, so that the hologram group 13 composed of a plurality of holograms 11 that have the same information and that partially overlap each other is formed as shown in FIG. 2.

Further, holograms 11 in other hologram groups 13 are formed one by one to be spaced apart from the holograms 11 in the hologram group 13, and thus it is possible to obtain the holographic recording medium 10 on which a plurality of hologram group 13 each composed of the plurality of holograms 11 is formed.

According to the holographic recording medium of the invention, a plurality of hologram groups each composed of a plurality of holograms is formed, and holograms in each of the hologram groups have the same information, respectively, partially overlap each other, and are arranged to be spaced apart from holograms in other hologram groups. Accordingly, even in a case in which the incidence angle of the reference beam deviates, the reference beam can be diffracted by any one of the holograms in each of the hologram groups.

Further, according to the holographic recording medium of the invention, each of the hologram groups is composed of a hologram formed by the object beam and the reference beam making a predetermined angle therebetween and a plurality of sub-holograms which have the same information and which are formed at an angle different from the predetermined angle between the reference beam and the object beam at which the hologram is formed. Accordingly, even in a case in which the incidence angle of the reference beam is different from when the information is written, the reference beam can be diffracted by a sub-hologram formed at the same angle as the information is read.

Furthermore, according to the holographic recording medium of the invention, the holograms in each of the hologram groups are arranged to have a periodic structure. Accordingly, even though the reference beam deviates in any direction, information can be read. As a result, it is possible to remove reading errors due to the deviation of the incidence angle.

Having described the embodiment of the present invention, it is to be understood that the invention is not limited thereto, but various changes and modifications thereof can be made without departing from the spirit and scope of the invention. For example, the number of the sub-holograms 12 constituting the hologram group 13 is not limited to the above embodiment, but it may be more than that of the embodiment, and vice versa. In addition, the arrangement of the hologram 11 and the sub-holograms 12 is not limited to FIG. 2, but other arrangements can be employed.

The invention claimed is:

1. A holographic recording medium having a recording layer on which holograms are formed by interference between an object beam and a reference beam to thereby record information, wherein the recording layer is formed with a plurality of hologram groups each composed of a plurality of holograms, wherein the holograms in each of the hologram groups have the same information, partially overlap each other, have non-overlapped portions, and are arranged to be spaced apart from holograms in other hologram groups, wherein adjunct ones of the holograms in each of the hologram groups which are located around a center hologram are overlapped with each other, and are overlapped with the center hologram, and wherein the adjunct ones of the holograms are not overlapped with at least some of the holograms.

2. The holographic recording medium according to claim 1, wherein each of the hologram groups is composed of a hologram formed by the object beam and the reference beam making a predetermined angle therebetween and a plurality of sub-holograms which have the same information and which are formed at an angle different from the predetermined angle between the object beam and the reference beam at which the hologram is formed.

3. The holographic recording medium according to claim 1, wherein the holograms in each of the hologram groups are arranged to have a periodic structure.

4. The holographic recording medium according to claim 2, wherein the holograms in each of the hologram groups are arranged to have a periodic structure.

* * * * *